United States Patent [19]

Nishikawa

[11] Patent Number: 4,857,484
[45] Date of Patent: Aug. 15, 1989

[54] METHOD OF MAKING AN ION-IMPLANTED BONDING CONNECTION OF A SEMICONDUCTOR INTEGRATED CIRCUIT DEVICE

[75] Inventor: Masami Nishikawa, Takatsuki, Japan

[73] Assignee: Ricoh Company, Ltd., Tokyo, Japan

[21] Appl. No.: 158,763

[22] Filed: Feb. 22, 1988

[30] Foreign Application Priority Data

Feb. 21, 1987 [JP] Japan .................................. 62-38500

[51] Int. Cl.$^4$ ......................................... H01L 21/265
[52] U.S. Cl. .................... 437/209; 437/199; 427/38
[58] Field of Search ................. 437/24, 199, 196, 197, 437/209; 427/38; 204/192.31

[56] References Cited

U.S. PATENT DOCUMENTS

| | | | |
|---|---|---|---|
| 3,328,210 | 6/1967 | McCaldin et al. | 437/24 |
| 3,562,022 | 2/1971 | Shifrin | 437/24 |
| 3,765,970 | 10/1973 | Athanas et al. | 437/197 |
| 3,912,546 | 10/1975 | Hunsperger et al. | 437/24 |
| 4,321,104 | 3/1982 | Hasegawa et al. | 437/197 |
| 4,534,105 | 8/1985 | Reusch | 357/75 |
| 4,622,576 | 11/1986 | Buynoski | 357/53 |
| 4,672,740 | 6/1987 | Shirari et al. | 437/197 |

FOREIGN PATENT DOCUMENTS

| | | | |
|---|---|---|---|
| 0183739 | 9/1985 | Japan | 437/197 |
| 0256626 | 11/1986 | Japan | 437/24 |

OTHER PUBLICATIONS

Kroemer, RCA Technical Notes, "Method of Making Ohmic Contacts to Silicon", PTO Library, 8/9/57.
IBM Technical Disclosure Bulletin, Brodsky, "Semiconductor Contacts", vol. 7, No. 6, Nov. 1964.

Primary Examiner—David L. Lacey
Assistant Examiner—L. Johnson
Attorney, Agent, or Firm—Oblon, Spivak, McClelland, Maier & Neustadt

[57] ABSTRACT

A method for forming a bonding connection in a semiconductor integrated cirucit device includes a step of ion implanting a bonding pad of aluminum with silicon atoms before bonding a bonding wire to the bonding pad. The silicon atoms are introduced into the bonding pad only at its surface and its vicinity, so that the bonding pad is provided with an enhanced humidity-resistant characteristic while maintaining the overall electrical resistance of an interconnection system at a low level.

1 Claim, 2 Drawing Sheets

METHOD OF MAKING AN ION-IMPLANTED BONDING CONNECTION OF A SEMICONDUCTOR INTEGRATED CIRCUIT DEVICE

BACKGROUND OF THE INVENTION

1. Field of the Invention

This invention generally relates to a method for forming a bonding connection in a semiconductor integrated circuit device, and in particular to a method for manufacturing a semiconductor integrated circuit device including a wire bonding connection.

2. Description of the Prior Art

It is common practice to use aluminum for interconnection lines in semiconductor integrated circuit devices. However, aluminum interconnection lines suffer from corrosion due mainly to the moisture content of the air, and such corrosion could cause malfunctioning of an integrated circuit. Under the circumstances, several approaches have been proposed to provide an enhanced humidity-resistant characteristic of a semiconductor integrated circuit device as follows.

(1) One approach would be to provide a plasma-produced nitride film as a passivation film. However, such a plasma-produced nitride film is poor in uniformity in thickness, which could adversely affect the performance of a transistor, such as fluctuations in the threshold voltage of a MOS transistor and in the amplification of a bipolar transistor.

(2) Another approach would be to use a dual-in-line package (DIP) as a package of a semiconductor integrated circuit device. However, as the size of a semiconductor integrated circuit device increases, there is a case in which use may not be made of a DIP and instead use must be made of a flat package, which is inferior in the humidity-resistant characteristic than the DIP package.

(3) A further approach would be to use silicon as added into aluminum interconnection lines. In this case, however, the overall resistance of interconnection lines is also increased.

SUMMARY OF THE INVENTION

In accordance with the principle of the present invention, there is provided a method for forming a bonding connection in a semiconductor integrated circuit device, comprising steps of introducing a selected impurity to a bonding pad and of bonding a bonding wire to the bonding pad thus introduced with the selected impurity. The selected impurity is a material for providing an enhanced humidity-resistance characteristic of a bonding connection when introduced into the bonding pad. Preferably, the introduction of the selected impurity is carried out by any ion-implantation technology. When the selected impurity is introduced into the bonding pad by ion implantation, the selected impurity is introduced only at the surface and its vicinity of the bonding pad, so that an increase of electrical resistance due to introduction of the selected impurity can be minimized even if such introduction of the selected material could cause an increase of electrical resistance of the bonding pad. In the preferred embodiment, the bonding pad defines part of a semiconductor integrated circuit device and it includes aluminum and the selected impurity includes silicon.

It is therefore a primary object of the present invention to obviate the disadvantages of the prior art as described above and to provide an improved method for forming a bonding connection.

Another object of the present invention i to provide an improved method for forming a bonding connection having an enhanced humidity-resistant characteristic without significantly increasing the overall electrical resistance.

A further object of the present invention is to provide an improved method for manufacturing a semiconductor integrated circuit device having a bonding connection which is not adversely affected by the humidity in the air.

Other objects, advantages and novel features of the present invention will become apparent from the following detailed description of the invention when considered in conjunction with the accompanying drawings.

DESCRIPTION OF THE PREFERRED EMBODIMENTS

Figure 1A:
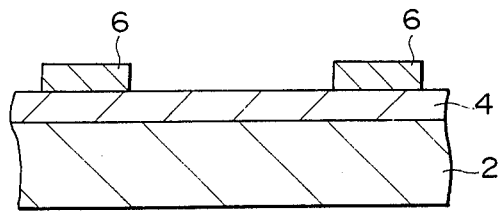
FIGS. 1a through 1d are schematic illustrations showing in cross section several steps of a process for forming a bonding connection in a semiconductor integrated circuit device in accordance with one embodiment of the present invention.

Referring now to FIGS. 1a through 1d, there is schematically shown a sequence of steps which constitute part of a process for manufacturing a semiconductor integrated circuit device. FIG. 1a illustrates a semiconductor structure which has been processed to a aluminum metallization step in a semiconductor manufacturing process. As shown, the illustrated semiconductor structure includes a silicon substrate 2 which is formed with various regions and components, such as diffusion regions and buried layers, so as to define various devices, such as transistors. An electrically insulating layer 4 preferably of $SiO_2$ is formed on the silicon substrate 2 as an interlayer insulating layer. Although not shown in FIG. 1a, the insulating layer 4 is typically formed with one or more contact holes through which metallization layer formed on the insulating layer 4 may make contact with desired regions defined in the silicon substrate 2. In the illustrated structure of FIG. 1a, an aluminum metallization layer is formed on the insulating layer 4 and it is patterned to define an interconnection line (not shown) and bonding pads 6. It will be appreciated that an interconnection extends from one of the bonding pads 6 and through one of contact holes (not shown) formed in the insulating layer 4 to make contact with a desired region (not shown) defined in the silicon substrate 2.

Figure 1B:
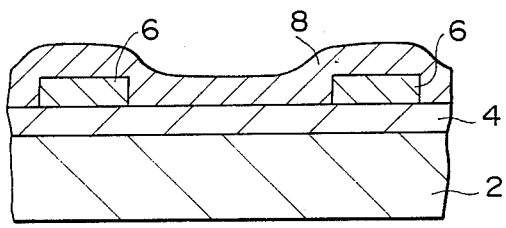
Figure 1C:
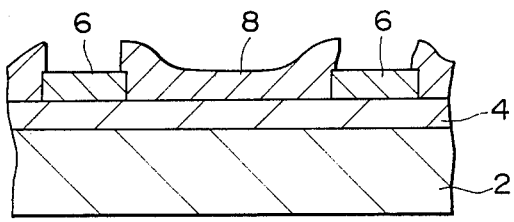
Figure 1D:
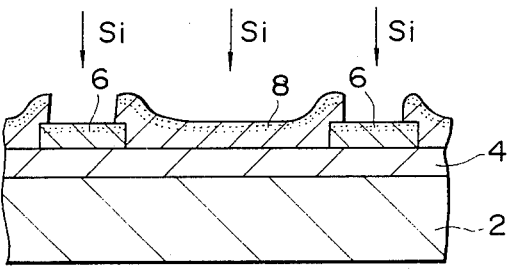

Next, as shown in FIG. 1b, a passivation layer 8 is formed across the entire surface of the semiconductor structure, covering the interconnection lines and the bonding pads 6. Then, as shown in FIG. 1c, that portion of the passivation layer 8 which is located above each of the bonding pads 6 is etched away by any selective etching method, such as photolithography, thereby causing the bonding pads 6 to be exposed. Then, as shown in FIG. 1d, a selected impurity, preferably silicon, is ion-implanted at 50 KeV and a dose of $5 \times 10^{15}$ ions/cm$^2$. As a result, as shown by dots in FIG. 1d, silicon ions are implanted at the surface and its vicinity of the bonding pad 6 and no silicon ions are implanted into the aluminum interconnection lines since they are masked by the remaining passivation layer 8.

It is to be noted that both of the bonding pad 6 and the aluminum interconnection typically have the thickness in the order of one micron; whereas, the depth of silicon ions implanted into the bonding pad 6 is in the order of 500 angstroms. Accordingly, with the application of ion implantation, only the surface and its vicinity of the bonding pad 6 is implanted with silicon ions and not the entire structure of the bonding pad 6. As a result, the overall electrical resistance of the bonding pad 6 may be maintained at a relatively low level even if silicon ions have been implanted into the bonding pad 6. On the other hand, since the surface and its vicinity of the bonding pad 6 is implanted with silicon ions, the bonding pad 6 is now provided with an increased humidity-resistant characteristic.

Figure 2A:
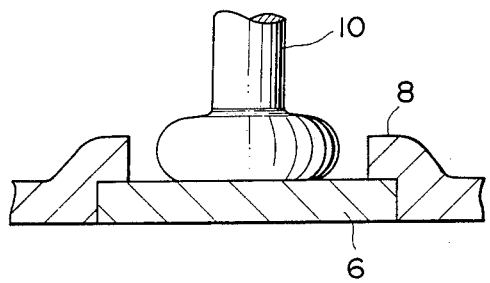
FIGS. 2a and 2b are schematic illustrations showing when a bonding pad has been bonded to a bonding pad.
Figure 2B:
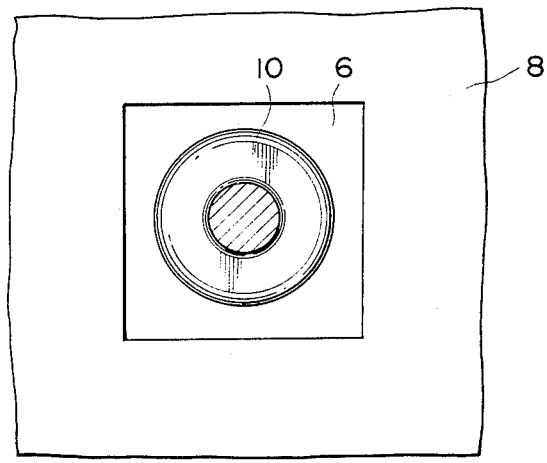

Then, as shown in FIGS. 2a and 2b, a bonding wire 10 of a selected electrically conductive material, such as gold, is bonded to the bonding pad 6 which has been implanted with silicon ions as described above. As may be seen from FIGS. 2a and 2b, that portion of the surface of the bonding pad 6 which remains to be exposed after bonding of the bonding wire 10 to the bonding pad 6 has been implanted with silicon ions as described above, so that the bonding pad 6 of aluminum is not adversely affected by the moisture content of the air even if it remains to be exposed. Suppose that no such introduction of silicon ions into the bonding pad 6 were carried out, if the bonding pad 6 comes into contact with water, such as moisture in the air, aluminum and water would react to produce $Al(OH)_3$ especially at elevated temperature. The presence of $Al(OH)_3$ tends to increase the electrical resistance of an aluminum interconnection line so that it may cause malfunctioning of a semiconductor integrated circuit device. However, in accordance with the principle of the present invention, since a selected impurity, preferably silicon, is introduced into a bonding pad of aluminum, the formation of $Al(OH)_3$ is effectively prevented at the exposed surface of the bonding pad.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A method for forming a bonding connection in a semiconductor integrated circuit device, comprising:
    (a) forming a bonding pad of aluminum on a semiconductor substrate over an intervening insulation layer;
    (b) ion implanting silicon ions into said bonding pad to a depth of about 500 Å from the bonding pad surface; and
    (c) bonding an electrically conductive wire to said bonding pad.

* * * * *